US007394256B2

(12) United States Patent
Schubert et al.

(10) Patent No.: US 7,394,256 B2
(45) Date of Patent: Jul. 1, 2008

(54) WRIST COIL FOR MAGNETIC RESONANCE IMAGING

(75) Inventors: Thomas E. Schubert, Delafield, WI (US); John M. Procarione, Pewaukee, WI (US); Ashok Menon, Milwaukee, WI (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 97 days.

(21) Appl. No.: 11/562,292

(22) Filed: Nov. 21, 2006

(65) Prior Publication Data

US 2007/0152667 A1 Jul. 5, 2007

Related U.S. Application Data

(60) Provisional application No. 60/739,553, filed on Nov. 23, 2005.

(51) Int. Cl.
*G01V 3/00* (2006.01)
*A61B 5/055* (2006.01)

(52) U.S. Cl. ...................... 324/321; 324/318; 324/309; 324/307; 600/410; 600/421; 600/422

(58) Field of Classification Search ......... 324/318–322, 324/309, 307; 600/410, 411, 415, 421, 422
See application file for complete search history.

(56) References Cited

U.S. PATENT DOCUMENTS

| | | | | |
|---|---|---|---|---|
| 5,543,710 | A * | 8/1996 | Jones | 324/318 |
| 5,682,098 | A * | 10/1997 | Vij | 324/318 |
| 6,011,393 | A * | 1/2000 | Kaufman et al. | 324/318 |
| 6,150,816 | A * | 11/2000 | Srinivasan | 324/318 |
| 7,098,660 | B2 * | 8/2006 | Contrada et al. | 324/318 |
| 2005/0090734 | A1 * | 4/2005 | Contrada et al. | 600/420 |
| 2007/0152667 | A1 * | 7/2007 | Schubert et al. | 324/318 |

* cited by examiner

*Primary Examiner*—Brij Shrivastav
*Assistant Examiner*—Tiffany A Fetzner

(57) ABSTRACT

Two halves of a separable wrist coil provide a coil volume closely conforming to a patient's hand yet separable for insertion and removal of the hand. The halves are hinged allowing easy one-handed operation of the coil in which an operator may stabilize the patient's hand within a propositioned coil with one hand while closing the coil and locking it in position with the other. Detents and a manual lock assist in this process.

15 Claims, 4 Drawing Sheets

14
15
10
20
3
74
74
79
67
35
30
28
70
6
18
12
79
79
67
68
70
34
24
3
6

79
10
18
67
79
34
12
32
82
26
70
68
67
82
80
20
14
84

14'
16
19
14
20
16'
22
24
28
30
18
12
35
79
79

14

38
40
16
46
44
42

44
14

16
38
46
42
40

WRIST COIL FOR MAGNETIC RESONANCE IMAGING

CROSS REFERENCE TO RELATED APPLICATION

This application claims the benefit of U.S. Provisional Application No. 60/739,553 filed Nov. 23, 2005 and hereby incorporated by reference.

BACKGROUND OF THE INVENTION

The field of the invention is magnetic resonance imaging (MRI) and, in particular, local coils for use in MRI of the wrist.

In MRI, a uniform magnetic field $B_0$ is applied to an imaged object to align the object's nuclear spins along a z-axis. In response to a radio frequency (RF) excitation signal of the proper frequency oriented within the x-y plane, the nuclei precess about the z-axis.

In a typical imaging sequence for magnetic resonance imaging, the precessing nuclear spins are then phase and frequency encoded according to their positions, using magnetic gradient fields. A weak nuclear magnetic resonance generated by the precessing nuclei may then be sensed by the RF coil and recorded as an NMR signal. From this NMR signal for a series of such signal acquisitions with different phase encodings, a slice image may be derived according to well-known reconstruction techniques in which the phase and frequency encoding is used to map NMR signal strength to different locations in the image.

The RF excitation and the NMR signal may be transmitted and received respectively by means of one or more RF coils. Improvements in the signal to noise ratio of the received NMR signal can be obtained by placing "local coils" on the patient. The local coil having a smaller reception pattern can focus in on the region of interest to obtain a stronger signal and to receive less noise. Phased array RF coils are multiple loop local coils whose outputs are processed separately and are electrically independent.

Desirably, a local coil may be "wrapped" about a portion of the body so that the volume within the local coil conforms closely to the imaged part. One way of accomplishing this is the use of flexible coils having thin copper conductors held in fabric-like panels that may be literally wrapped about the patient.

Coils with rigid structure can also be used but for such coils the ability to have the local coil closely conform to the patient is limited by the ability of the patient to thread his or her limb into the coils structure. For this reason, it is known to construct coils, for example, for imaging the hand or wrist, in two parts that may be separated from each other along a seam line so that the hand may be inserted, and then reassembled using several clamps holding the two parts together about the limb. Such coils provide good support for the antenna structure and the patient's limb but can be cumbersome for the MRI operator who must contend with positioning the patient and manipulating the loose part of the coil into alignment and managing the clamps necessary to hold the pieces together.

SUMMARY OF THE INVENTION

The present invention provides a two part rigid coil for imaging the wrist or other body member in which the two parts are held by a hinge structure allowing the coil to be opened for insertion of a limb and then to be hinged closed. The hinge, by limiting the freedom of motion of the moving portion of the coil, greatly simplifies the positioning of the patient and assembly of the parts, particularly when the coil is positioned with the hinge axis vertically. An automatically operating detent and lock can allow the operator to avoid the need to contend with cumbersome mechanical clasps and the like normally used in two-part designs.

Specifically, then, the present invention provides an MRI local coil suitable for imaging portions of a human limb having a pair of shells interfitting along a seam to define a volume closely conforming to the human limb, and a hinge attaching the shells so that the shells may hinge apart about the seam to permit the limb to be inserted into or removed from between the shells and hinge together along the seam. Antenna conductors are held by the shells to provide detection of NMR signals from the wrist when the shells are hinged together.

It is thus one aspect of at least one embodiment of the invention to provide a two-part wrist coil allowing close conformance to the wrist and where the parts remain connected for rapid set up by an operator The volume may allow insertion of the human limb into the volume to extend along a first axis and wherein the hinge provides rotation of one shell with respect to the other shell along a second axis perpendicular or parallel to the first axis.

It is another object of the invention to provide a hinge axis that provides a clear view of the patient's hand when used on both the left and right patient's hand during set up.

The hinge axis may be displaced with respect to the volume to not intersect the volume.

It is another aspect of at least one embodiment of the invention to provide a location of the hinge axis so that opening of the parts does not cause a compression of the hand located between the shells.

The volume may be open at opposite ends of the local coil along the axis when the shells are hinged together and when the shells are hinged apart.

It is another object invention to provide a coil that allows free extension of the fingers for different sized patients and for increased patient comfort.

The volume provides a first channel for receiving a wrist connecting to a second broader channel for receiving a hand. A wall of the volume adjacent to a palm of the hand when the hand is positioned in the volume may present a surface that curves along an axis of the hand to conform to the palm.

It is another aspect of at least one embodiment of the invention to provide a coil that may closely conform to the wrist area for improved imaging of the wrist bones.

The seam may provide a plurality of electrical connectors joining when the shells are hinged together to provide electrical conduction paths for the antenna conductors.

It is another aspect of at least one embodiment of the invention to provide a hinge axis that provides a clean electrical connection and disconnection of coil portions in each of the wrist shells.

The antenna conductors may be conductors of a phased array coil.

It is another aspect of at least one embodiment of the invention to provide a support for a coil allowing the coils to be electrically continuous about the hand when the shells are closed, providing for improved imaging.

The coils may include a mechanical detent biasing the hinge toward a closed position when the shells are proximate to each other about the seam and/or biasing the hinge away from a closed position when the shells are not proximate to each other about the seam.

It is another aspect of at least one embodiment of the invention to provide stability in the hinged halves of the shell to assist the operator in positioning the patient in the shell.

The coil may further include a manually actuated lock, the lock locking the shells together when the shells are in a closed position.

It is another aspect of at least one embodiment of the invention to provide for a positive locking of the shells after initial location by detent.

The invention may further include a stand fitting against a patient table and having engagement means engaging with an edge of at least one shell to hold the shell so that a plane of the seam extends generally vertically or horizontally.

It is another aspect of at least one embodiment of the invention to allow the shells to be pre-positioned before insertion of the patient's hand for multiple orientations of the wrist coil for different imaging purposes.

These particular objects and advantages may apply to only some embodiments falling within the claims and thus do not define the scope of the invention.

DETAILED DESCRIPTION OF THE PREFERRED EMBODIMENT

Figure 1:
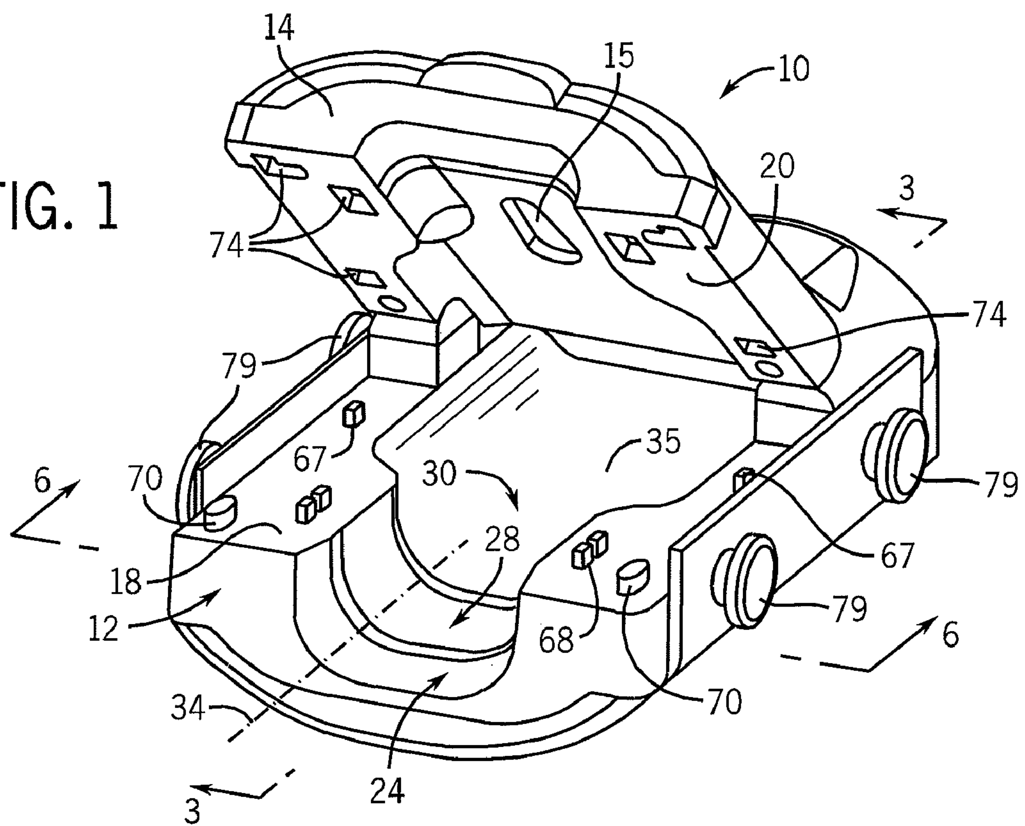
FIG. 1 is a perspective view of a wrist coil of the present invention having hinged shells in an open position.
Figure 2:
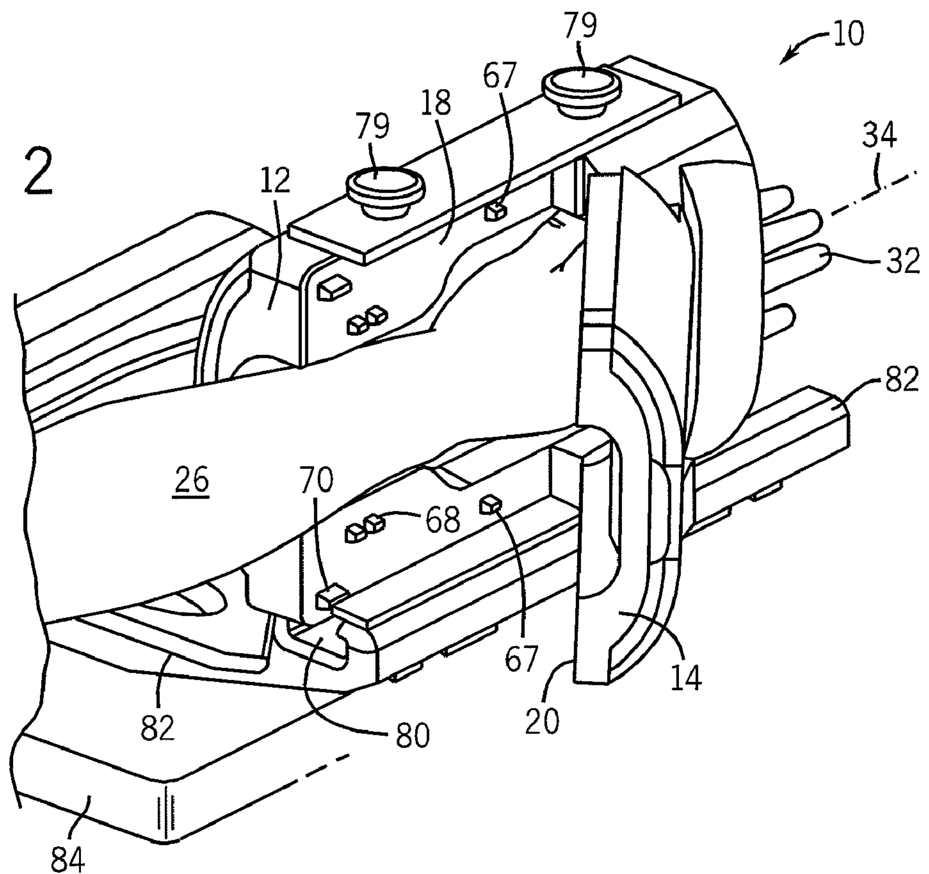
FIG. 2 is a perspective view similar to that of FIG. 1 of the wrist coil assembled on a base unit for use on a patient's right hand in a palm-vertical orientation.
Figure 3:
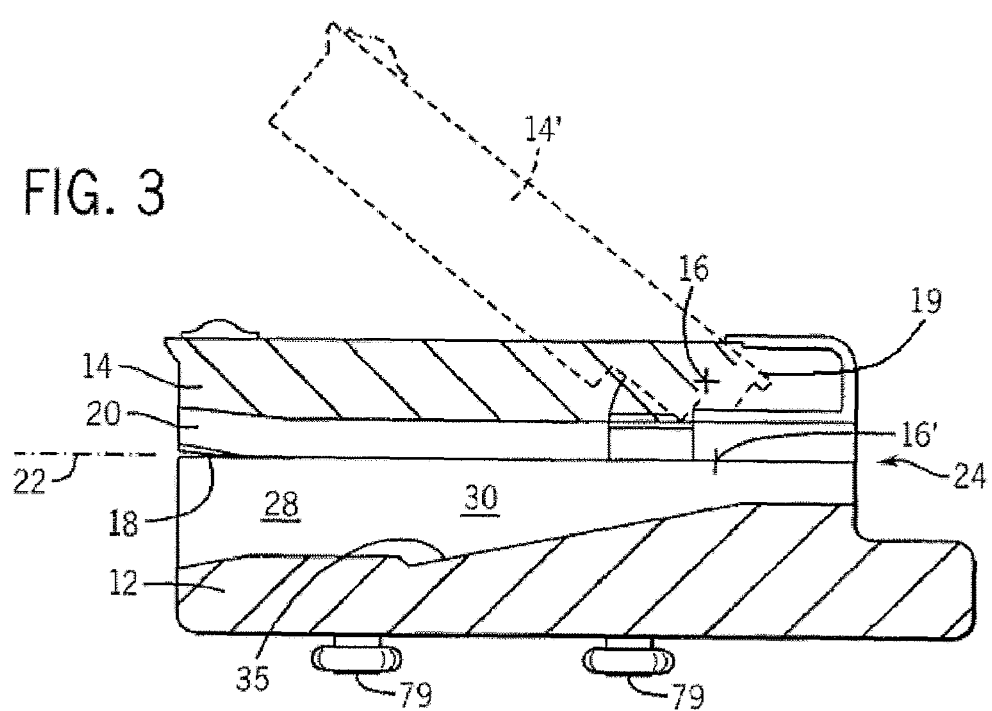
FIG. 3 is an elevational cross-sectional view through the coil of FIG. 1 along lines 3-3 of FIG. 1 showing a curved support surface position near the palm of the user and showing a position of the hinge line preventing entrapment of the patient's hand as the shells are opened.
Figure 4:
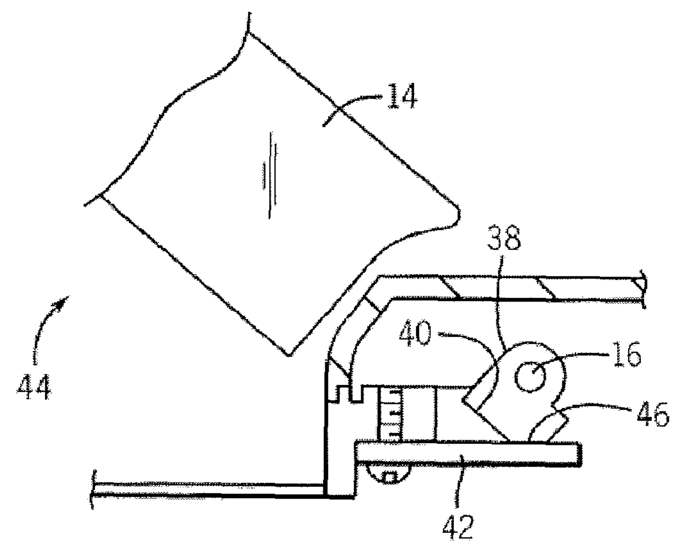
FIGS. 4 and 5 are detailed views all a hinge of FIG. 3 showing a spring detent that biases the shell's bistability in the open and closed positions.
Figure 5:
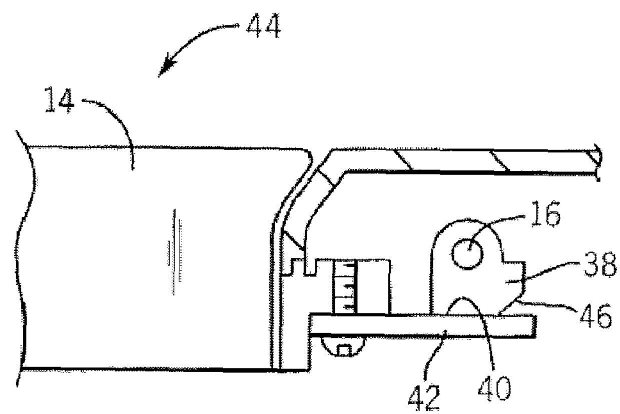

Referring now to FIGS. 1 and 2, a wrist coil 10 of the present invention may include a first shell 12 and a second hingable shell 14 hinging with respect to shell 12 along a hinge axis 16, as shown in FIGS. 3-5. The shells may be constructed of a rigid polymer material to be compatible with the magnetic and radiofrequency fields of a MRJ machine (not shown) in which the wrist coil 10 will be used.

The shells 12 and 14 are connected together to hinge about a hinge axis 16 between an open position (as shown) and a closed position in which a generally planar seam surface 18 of shell 12 abuts generally planar seams surface 20 of shell 14, and the shells together define an internal hand volume 24 extending along axis 34 and are sized to receive a human hand 26. The hinge axis 16 is generally perpendicular to the axis 34 of the hand volume 24.

A seam interface 22, generally dividing the shells 12 and 14 along their respective seam surfaces 18 and 20 when the shells 12 and 14 are closed, approximately bisects the hand volume 24, so that when the shells 12 and 14 are opened with respect to each other, a hand 26 may be inserted between the shells 12 and 14 with axial motion along axis 34 and then moved laterally into the portion of the hand volume 24 defined by shell 12.

The hand volume 2 includes a narrow wrist portion 28 for receiving the wrist of the hand 26 which joins with an expanded hand portion 30 receiving the fingers of the hand 26. The hand volume 24 is open at opposite ends, at the wrist portion 28 and at the hand portion 30, so that the fingers 32 may extend out of the hand portion 30 as shown in FIG. 2. The hand portion 30 expands laterally and provides a conformal palm surface 35 properly positioning the hand as may be desired for scanning. In addition radiofrequency transparent foam cushions (not shown) may be placed within the hand volume 24 to provide for additional support and stabilization of the hand 26 in the shells 12 and 14 when they are closed. Generally, the close conformance of the shells 12 and 14 to the hand 26 prevent withdrawal of the hand 26 when the shells 12 and 14 are closed.

Referring now to FIG. 3, the hinge axis 16 is displaced away from the hand volume 24 so as not intersect the hand volume 24 so that the shell 14 may hinge upward (as shown by shell 14') without notably decreasing the volume of the hand volume 24 such as may create a compression or pinching of the hand 26 placed there in the hand volume 24. This may be contrasted to a location of a hinge axis 16' along seam interface 22 such as would cause the leading upper edge 19 of the shell 14 to pivot down into the hand volume 24.

Referring to FIG. 4 and 5, a cam 38 coaxial with the hinge axis 16 and turning with the shell 14 may have a first flat 40 compressed by leaf spring 42 to bias the shell 14 in a closed direction 44 when the shell 14 is proximate to the shell 12. Conversely as shown in FIG. 5, the cam 38 may present a second flat 46 compressed by the leaf spring 42 when the shell 14 is in the open position tending to hold the shell 14 in the open position. Thus the shell 14 may be bi-stable, tending to remain in an open or closed position. This bi-stability keeps the shell 14 from moving accidentally and interfering with proper positioning of the patient's hand 26 by an operator. The bi-stability also holds the shell 14 closed allowing one-handed operation of a lock to be described below, so that the operator may stabilize the patient's hand 26 in the shell 12 with one hand while closing the shell 14 with the other hand, and then moving a hand from the shell 14 to the lock with certainty that the shell 14 will remain closed until the locking is complete.

The first shell 14 may have an observation hole 15, as shown in FIG. 1, passing from an outer surface of the shell 14 and into the hand volume 24 further improving air circulation and allowing the operator to confirm the location of the patient's wrist within the wrist coil 10 when the shells are closed.

Figure 6:
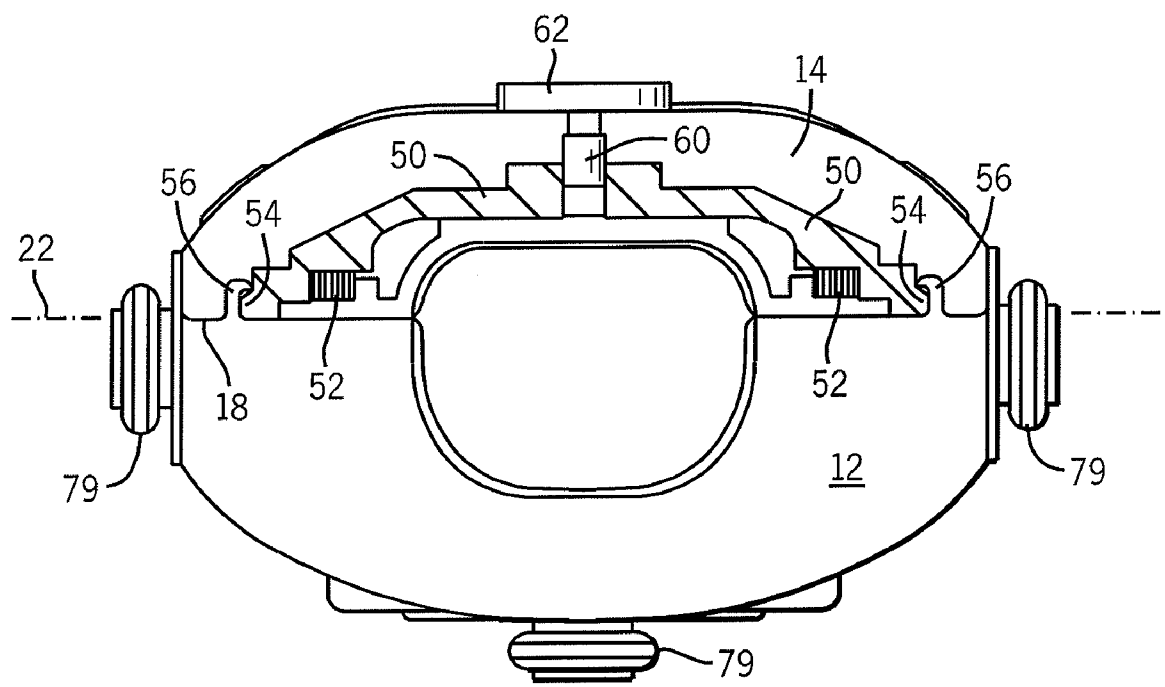
FIG. 6 is a cross-sectional view along line 6-6 of FIG. 1 showing a second detent/lock mechanism for holding the shells in a closed position and locking the shells closed.

Referring to FIG. 6, shell 14 may further include a set of lock arms 50 biased outwardly by compression springs 52 perpendicular to axis 34 and generally along the seam interface 22. Outwardly opposed teeth 54 on each of the lock arms 50 near the surface 20 engage corresponding tabs 56 extending upward from surface 18 of shell 12. The teeth 54 are beveled at a surface of contact between the teeth 54 and the tabs 56 with closure of the shell 14 so that the teeth 54 and lock arms 50 are pressed inward against their springs 42 so that the teeth 54 pass by an upper side of a lip of the tabs 56 and then spring outward to engage a lower side of the lip of the tabs when the shells 12 and 14 are fully closed against each other. This spring action provides a second detent mechanism allowing the shell 14 to snap closed against shell 12 with slight operator pressure.

Conversely, the teeth 54 are also beveled at a surface of contact between the teeth 54 and the tabs 56 with the opening of the shell 14 so that the teeth 54 and lock arms 50 are also pressed inward against their springs 42 allowing the teeth 54 pass the lower side of a lip of the tabs 56 with upward force on the shell 14. This allows the shell 14 to be opened simply by applying sufficient force to the shell 14.

Figure 7:
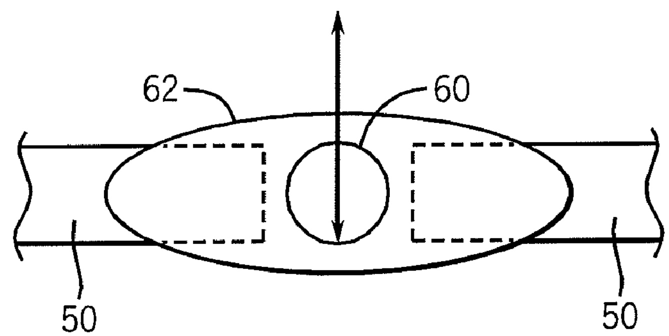
FIG. 7 is a top plan view in phantom of a lock button of the detent/lock of FIG. 6 moving to slide a peg between two arms of the detent/lock preventing the release of the door.

Referring also to FIG. 7, when the teeth 54 are engaged with the tabs 56 with the shell 14 in the closed position, a peg 60 extending downwardly from a lock button 62 slidable generally along axis 34 may be placed between two adjacent ends of the lock arms 50 preventing the lock arms 50 from moving inward and effectively locking the shell 14 in the closed position. The peg 60 may be so inserted or removed by an axial sliding action of lock button 62.

Figure 8:
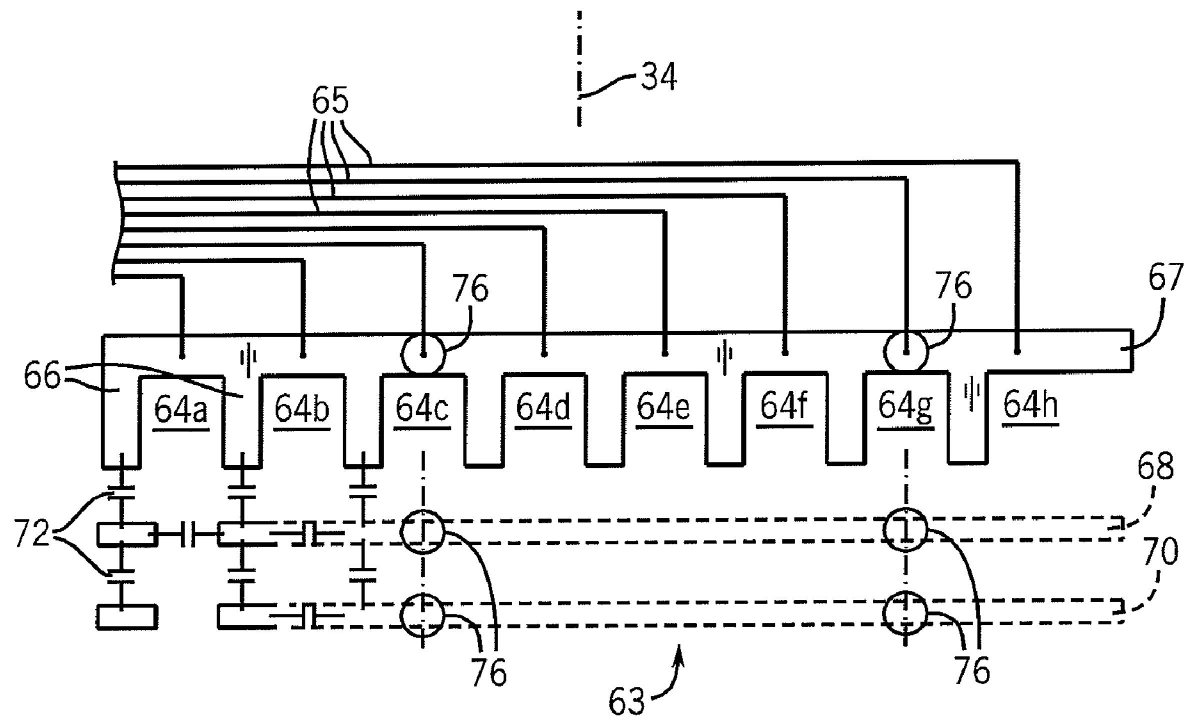
FIG. 8 is a schematic unrolled representation of the coil assembly of the wrist coil of FIG. 1 showing the capacitive decoupling network used to isolate the individual phased array coil.
Figure 9:
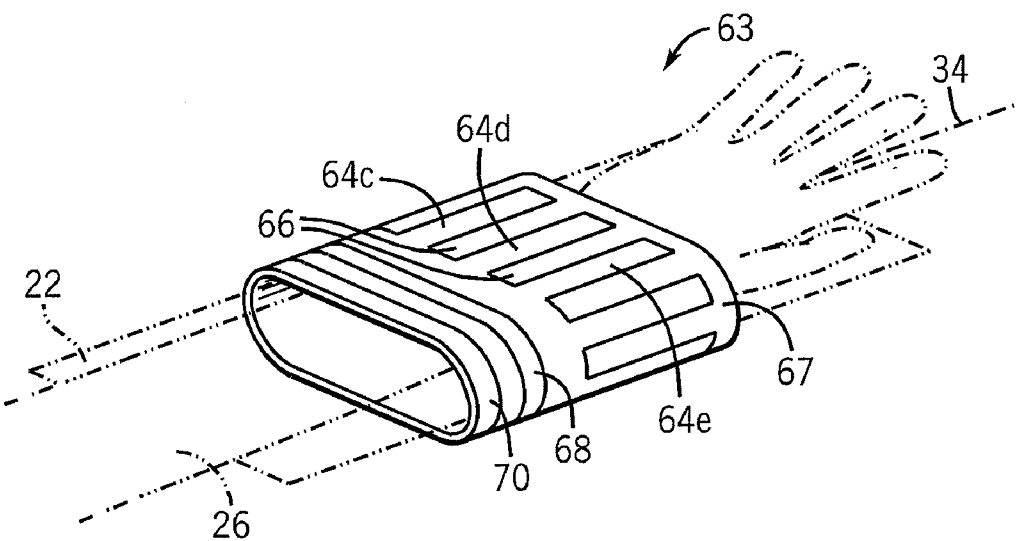
FIG. 9 is a figure showing the coil assembly as rolled inside the shells of the wrist coil of FIG. 1.

Referring now to FIG. 8, a phased array coil 63 may be held within the shells 12 and 14 of the wrist coil 10 to surround the wrist of the hand 26 when the hand is inserted in the coil 10 and to provide for an eight channel phased array coil positioned generally about the wrist of the hand 26. Phased array coil 63 provides eight isolated loops 64*a* through 64*h* formed of eight axial conductors 66 and three circumferential conductors 67, 68 and 70 connected by coupling and isolation capacitors 72. A coil design suitable for this purpose is described in U.S. Pat. No. 7,091,721 issuing Aug. 15, 2006, entitled: "Phased array local coil for MRI imaging having non-overlapping regions of sensitivity" and hereby incorporated by reference. Referring to FIG. 9 the phased array coil 63 of FIG. 8 wraps circularly and continuously electrically about the hand 26 of the patient. Each of the loops 64*a* through 64*h* provides for a separate channel output 65 that may be attached to the MRI machine for the production of independent images or to be combined for improved signal to noise ratio.

Referring also to FIG. 1 conductors 67, 68 and 70 are exposed on surfaces 18 in the form of connector tabs 78 that engage with corresponding connect slots 74 in seam surface 20 so that electrical continuity can be had across the seam interface 22 for conductors 67, 68 and 70 as they encircle the wrist. These points of connection are also shown in FIG. 8. The geometry of the hinge axis 16 allows a hinging action permitting clean engagement and disengagement of these electrical connectors.

Referring again to FIGS. 1 and 2 and 3, posts 79 with spring-loaded radially extending heads may be positioned on the right and on the left coil 10 along the seam interface 22 and positioned on the bottom of the shell 12 as shown in FIG. 8. These posts 79 may fit within a corresponding key slot 80 in a base unit 82 fitting against the upper surface of a patient table 84 and be held by the weight of the patient thereupon. In this way different orientations of the wrist coil 10 may be supported by the base, with the seam interface 22 vertically as shown in FIG. 2 for the right hand, or inverted for the left hand, or with the seam plane horizontal.

It is specifically intended that the present invention not be limited to the embodiments and illustrations contained herein, but include modified forms of those embodiments including portions of the embodiments and combinations of elements of different embodiments as come within the scope of the following claims.

What we claim is:

1. An MRI local coil suitable for imaging portions of a human limb on either side of and including a human wrist, comprising:

a pair of shells inter-fitting along a seam in order to define a volume closely conforming to the human limb, one of the pair of shells forming a passage configured for receiving a portion of the human limb, the passage constructed in order to enclose the portion of the human limb regardless of a relative orientation of the other shell;

a hinge attaching the shells so that the shells may hinge apart about the seam in order to permit the limb to be inserted into or removed from between the shells, and hinge together along the seam; and antenna conductors held by the shells configured to provide detection of NMR signals from the wrist when the shells are hinged together.

2. The MRI local coil of claim 1 wherein the volume allows insertion of the human limb into the volume in order to extend along a first axis and wherein the hinge provides rotation of one shell with respect to the other shell along a second axis perpendicular to the first axis.

3. The MRI local coil of claim 2 wherein the hinge axis is displaced with respect to the volume in order to not intersect the volume.

4. The MRI local coil of claim 2 wherein the volume is open at opposite ends of the local coil along the first axis when the shells are hinged together and when the shells are hinged apart.

5. The MRI local coil of claim 1 wherein the volume provides a first channel configured for receiving a wrist connecting to a second broader channel configured for receiving a hand.

6. The MRI local coil of claim 1 wherein the seam provides a plurality of electrical connectors joining when the shells are hinged together in order to provide electrical conduction paths for the antenna conductors.

7. The MRI local coil of claim 1 wherein the antenna conductors are conductors of a phased array coil.

8. The MRI local coil of claim 1 further including a mechanical detent biasing the hinge toward a closed position when the shells are proximate to each other about the sea.

9. The MRI local coil of claim 8 further including a mechanical detent biasing the hinge away from a closed position when the shells are not proximate to each other about the seam.

10. The MRI local coil of claim 8 further including a manually actuated lock, the lock locking the shells together when the shells are in a closed position.

11. The MRI local coil of claim 1 further including a stand fitting against a patient table and having engagement means engaging with an edge of at least one shell in order to hold the one shell so that a plane of the seam extends generally vertically.

12. The MRI local coil of claim 1 further including a stand fitting against a patient table and having engagement means engaging with an edge of at least one shell in order to hold the shell so that a plane of the seam extends generally horizontally.

13. The MRI local coil of claim 1 wherein the volume positions a palm of a hand generally parallel to a plane of the seam.

14. The MRI local coil of claim 1 wherein a wall of the volume adjacent to a palm of a hand when the hand is positioned in the volume, presents a surface that curves along an axis of the hand in order to conform to the palm.

15. An MRI local coil suitable for imaging portions of a human limb on either side of and including a human wrist, comprising:

a pair of shells inter-fitting along a seam in order to define a volume closely conforming to the human limb;

a hinge attaching the shells so that the shells may hinge apart about the seam in order to permit the limb to be inserted into or removed from between the shells, and hinge together along the seam, the hinge being oriented in a crossing direction relative to a longitudinal axis of the human limb being imaged; and antenna conductors held by the shells configured to provide detection of NMR signals from the wrist when the shells are hinged together.

* * * * *